(12) United States Patent
Sakurai

(10) Patent No.: US 8,591,656 B2
(45) Date of Patent: Nov. 26, 2013

(54) COMPOUND SEMICONDUCTOR MANUFACTURING DEVICE, COMPOUND SEMICONDUCTOR MANUFACTURING METHOD, AND JIG FOR MANUFACTURING COMPOUND SEMICONDUCTOR

(75) Inventor: Tetsuo Sakurai, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 13/126,110

(22) PCT Filed: Nov. 4, 2009

(86) PCT No.: PCT/JP2009/068834
§ 371 (c)(1),
(2), (4) Date: Apr. 26, 2011

(87) PCT Pub. No.: WO2010/053094
PCT Pub. Date: May 14, 2010

(65) Prior Publication Data
US 2011/0207299 A1  Aug. 25, 2011

(30) Foreign Application Priority Data
Nov. 5, 2008 (JP) .................. 2008-284349

(51) Int. Cl.
*C23C 16/00* (2006.01)

(52) U.S. Cl.
USPC .................. 118/728; 118/732; 156/345.3

(58) Field of Classification Search
USPC ........................................ 156/345.3
See application file for complete search history.

(56) References Cited

U.S. PATENT DOCUMENTS 6,007,673 A    12/1999  Kugo et al.
6,558,505 B2 *  5/2003  Suzuki et al. .............. 156/345.3
2003/0024642 A1  2/2003  Suzuki et al.
2003/0029565 A1  2/2003  Suzuki et al.
2003/0124842 A1  7/2003  Hytros et al.
2004/0200412 A1  10/2004  Frijlink

FOREIGN PATENT DOCUMENTS

| JP | 10-163180 A | 6/1998 |
| JP | 11-283972 A | 10/1999 |
| JP | 2000-228398 A | 8/2000 |
| JP | 2002-234793 A | 8/2002 |
| JP | 2003-518199 A | 6/2003 |
| JP | 2008-247639 A | 10/2008 |

OTHER PUBLICATIONS

English translation of Office Action issued Jan. 7, 2013 for counterpart German Patent Application No. 11 2009 002 396.7.

* cited by examiner

*Primary Examiner* — Yasser Abdelaziez
(74) *Attorney, Agent, or Firm* — Sughrue Mion, PLLC

(57) ABSTRACT

When compound semiconductor layers are formed on a compound semiconductor substrate (40) by sequentially layering group III nitride semiconductor crystalline layers by metal organic chemical vapor deposition method, the compound semiconductor substrate (40) is attached inside of a reaction container with the crystal growth surface thereof facing upward, a protection member (60) having plural grooves (63) formed in a radiating manner on the side facing the crystal growth surface is attached above the compound semiconductor substrate (40), and a material gas is supplied to the inside of the reaction container through a first through hole (61) provided in the center of the protection member (60). Thereby, in the manufacture of a compound semiconductor using metal organic chemical vapor deposition method, a decrease in yield caused by adhesion of peeled-off reaction byproducts to the substrate or to the epitaxially grown film on the substrate is suppressed.

12 Claims, 8 Drawing Sheets

COMPOUND SEMICONDUCTOR MANUFACTURING DEVICE, COMPOUND SEMICONDUCTOR MANUFACTURING METHOD, AND JIG FOR MANUFACTURING COMPOUND SEMICONDUCTOR

TECHNICAL FIELD

The present invention relates to a compound semiconductor manufacturing device and a compound semiconductor manufacturing method for manufacturing a compound semiconductor by use of metal organic chemical vapor deposition method, and a jig for manufacturing a compound semiconductor used in the compound semiconductor manufacturing device.

BACKGROUND ART

Recently, there have been widely used various semiconductor devices, such as a light emitting diode (LED), a field effect transistor (FET) and a high electron mobility transistor (HEMT), using a compound semiconductor.

Metal organic chemical vapor deposition method (hereinafter, referred to as MOCVD method) is known as one method to grow such a compound semiconductor crystal.

In the MOCVD method, a group III organometallic material gas and a group V material gas, for example, are supplied into a reaction chamber as a mixed gas with a high purity hydrogen carrier gas, the materials are pyrolyzed around a substrate heated in the reaction chamber, and a compound semiconductor crystal is epitaxially grown on the substrate, thereby to obtain a compound semiconductor wafer.

As a conventional art described in an official gazette, there is a technique in which plural growth wafers being growth targets of compound semiconductor crystals are arranged with growth surfaces of crystals facing upward within an epitaxial growth furnace to which a material gas is supplied, in an MOCVD apparatus using the MOCVD method (see Patent Document 1).

Additionally, as a conventional art described in another official gazette, there is a technique in which an MOCVD apparatus using the MOCVD method is provided with a substrate holder rotating while holding plural substrates with growth surfaces of compound semiconductor crystals facing upward, and a cover plate provided above the substrate holder so as to face the substrate holder, within a reaction chamber to which a material gas is supplied. In the MOCVD apparatus, the material gas is supplied from a center portion of the cover plate toward the substrates held by the substrate holder (see Patent Document 2).

Patent Document 1: Japanese Patent Application Laid Open Publication No. 2002-234793
Patent Document 2: Japanese Patent Application Laid Open Publication No. 2003-518199

DISCLOSURE OF THE INVENTION

Problems to be Solved by the Invention

In the above MOCVD method, a reaction byproduct (for example, a compound semiconductor) produced in the reaction chamber by a reaction of a material gas adheres or deposits on the inner wall and the like of the reaction chamber.

The reaction byproduct having adhered or deposited in this manner is removed by cleaning after a film of a compound semiconductor is manufactured on a substrate by the MOCVD method.

However, a part of the reaction byproduct having adhered or deposited on the inner wall of the reaction chamber may peel off from the inner wall and the like of the reaction chamber during an operation of film manufacture of the compound semiconductor. If a lump of the compound semiconductor peeled off in this manner drops on a growth surface of the substrate, a compound semiconductor layer formed on the substrate includes the lump of the reaction byproduct.

As a result, a region to which a lump of the reaction byproduct adheres is not available as a final product, namely, a semiconductor device, which leads to a decrease in yield in manufacture of semiconductor devices by using substrates on which compound semiconductor layers are formed.

Additionally, an excessive number or amount of reaction byproducts adhering to a substrate have no choice but to discard the substrate itself on which compound semiconductor layers are formed, which leads to a decrease in yield in manufacture of substrates on which compound semiconductor layers are formed.

An object of the present invention is to suppress a decrease in yield caused by adhesion of a peeled-off reaction byproduct to the substrate or to the epitaxially grown film on the substrate, in the manufacture of a compound semiconductor using metal organic chemical vapor deposition method.

Means for Solving the Problems

In order to attain the above object, the present invention is a compound semiconductor manufacturing device for forming layers of a compound semiconductor by use of metal organic chemical vapor deposition method including: a reaction container; a material supply port supplying a material gas of the compound semiconductor into the reaction container from outside; a support placed in the reaction container, the support supporting a formed body so that a formed surface of the formed body faces upward; and a facing member placed above the formed body supported by the support, the facing member including a facing surface having asperities formed thereon, the facing surface facing the formed surface.

In such a compound semiconductor manufacturing device, a groove composed of a continuous concave is formed in the facing surface of the facing member. The material supply port is composed of a through hole provided for the facing member, and the groove extending from inside to outside with the through hole as a center is formed in the facing surface of the facing member. Furthermore, the groove is plural grooves formed in a radiating manner with the through hole as a center.

In another aspect of the present invention, the present invention is a compound semiconductor manufacturing method for forming layers of a compound semiconductor on a formed surface of a formed body by use of metal organic chemical vapor deposition method including: attaching the formed body in a reaction container so that the formed surface faces upward; placing a facing member above the formed body, the facing member including a facing surface having asperities formed thereon, the facing surface facing the formed surface; and supplying a material gas of the compound semiconductor into the reaction container.

In such a compound semiconductor manufacturing method, a continuous groove is formed in the facing surface. The material gas is supplied into the reaction container through a through hole provided for the facing member, and the groove extending from inside to outside with the through hole as a center is formed in the facing surface. Furthermore, the groove is plural grooves formed in the facing surface in a radiating manner with the through hole as a center.

In a further aspect of the present invention, the present invention is a jig for manufacturing a compound semiconductor used in a compound semiconductor manufacturing device for forming layers of a compound semiconductor by use of metal organic chemical vapor deposition method including: a facing surface having asperities, the facing surface facing a formed body above the formed body placed so that a formed surface thereof faces upward; and a material supply port formed so as to penetrate the facing surface and a back side of the facing surface, the material supply port supplying a material gas of the compound semiconductor to the formed body from above the formed body.

In such a jig for manufacturing a compound semiconductor, a continuous groove is formed in the facing surface. The groove extending from inside to outside with the material supply port as a center is formed in the facing surface. Furthermore, the groove is plural grooves formed in a radiating manner with the material supply port as a center.

Advantages of the Invention

According to the present invention, it is possible to suppress a decrease in yield caused by adhesion of a peeled-off reaction byproduct to the substrate or to the epitaxially grown film on the substrate, in the manufacture of a compound semiconductor using metal organic chemical vapor deposition method.

BEST MODES FOR CARRYING OUT THE INVENTION

Hereinafter, an exemplary embodiment of the present invention will be described in detail with reference to the accompanying drawings.

FIG. 1 is a diagram showing a cross-sectional configuration of an MOCVD (metal organic chemical vapor deposition) apparatus 1 as an example of a compound semiconductor manufacturing device to which the present exemplary embodiment is applied. FIG. 2 is a cross-sectional view of the MOCVD apparatus 1 shown in FIG. 1, taken along a line II-II.

This MOCVD apparatus 1 allows for arbitrary selection from substrates 110 (see FIG. 4 to be described later) for epitaxially growing a compound semiconductor crystal and a compound semiconductor substrates (compound semiconductor substrates 40 are also listed as an example, and these may be referred to as formed body in this description) composed by forming in advance at least one compound semiconductor layer having an arbitrary composition further on each substrate 110. The MOCVD apparatus 1 has a so-called vertical configuration in which, for example, when the compound semiconductor substrates 40 are used, the compound semiconductor substrates 40 are placed with crystal growth surfaces thereof facing upward and a material gas being a material of crystals to be epitaxially grown is supplied from above the compound semiconductor substrates 40.

The MOCVD apparatus 1 includes: a reaction container 10 in which a reaction chamber is formed; and a support 20 placed in the reaction chamber of the reaction container 10.

Among these, the reaction container 10 includes: a container 11 that has a cylindrical shape, is provided with an aperture facing upward and contains the support 20 therein; and a lid portion 12 that has a disk shape and is attached to an upper portion of the container 11.

The container 11 and the lid portion 12 are composed of metal such as stainless steel. The lid portion 12 is attached so as to be openable and closable with respect to the container 11, and forms the reaction chamber together with the container 11 when closed with respect to the container 11. A seal member, such as an unillustrated o-ring, is attached to a region where the container 11 and the lid portion 12 face each other.

A through hole to supply a material gas into the reaction chamber from a gas supply mechanism (not shown) provided outside is formed at the center of the lid portion 12. A supply pipe 13 is connected to this through hole. Additionally, a through hole to observe the inside of the reaction chamber from outside is also formed at a position apart from the center of the lid portion 12.

On the other hand, plural exhaust pipes to exhaust the material gas having supplied into the reaction chamber to the outside of the reaction chamber are formed to penetrate in the bottom of the container 11. Additionally, a through hole for a shaft 21 described below to run through is also formed in the center of the bottom of the container 11.

Now, the material gas used in the MOCVD apparatus 1 is described.

In the present exemplary embodiment, the MOCVD apparatus 1 is used to form compound semiconductor layers having an arbitrary composition on the respective substrates 110 in advance and further to form group III nitride semiconductor layers on each of the resultant compound semiconductor substrates 40. For this reason, organic metal including a group III element and ammonia $NH_3$ including nitrogen are used as the material. However, since organic metal is primarily a liquid material, liquid organic metal is subjected to bubbling with nitrogen $N_2$ and hydrogen $H_2$, and a resultant organometallic gas MO composed of a mixture of the nitrogen $N_2$ and hydrogen $H_2$ and organic metal is supplied as the material gas. In the present exemplary embodiment, the organometallic gas MO and ammonia $NH_3$ are supplied form the supply pipe 13.

As the organic metal, listed are: trimethylgallium (TMG) or triethylgallium (TEG) including group III Ga, for example, trimethylaluminum (TMA) or triethylaluminium (TEA) including group III Al, for example, and trimethylindium (TMI) or triethylindium including group III In, for example.

For n-type dopant, monosilane ($SiH_4$) or disilane ($Si_2H_6$) may be used as an Si material, or germane gas ($GeH_4$), tetramethylgermanium (($CH_3)_4Ge$) or tetraethylgermanium (($C_2H_5)_4Ge$) may be used as a Ge material. On the other hand, for p-type dopant, biscyclopentadienylmagnesium ($Cp_2Mg$) or bisethylcyclopentadienylmagnesium ($EtCp_2Mg$), for example, may be used as an Mg material. Additionally, hydrazine ($N_2H_4$) may be used instead of ammonia. Note that, besides the above-mentioned organic metal MO, a composition containing another group III element may be employed, and dopant, such as Ge, Si, Mg, Ca, Zn and Be, may be contained as necessary. Moreover, not only an intentionally added element, but also impurities necessarily included depending on a condition or the like of film formation and a small quantity of impurities included in a raw material or a material of a reaction tube may be included.

The support 20 has a disk shape, and is placed in the container 11 so that one surface, namely, the front surface faces upward and the other surface, namely, the back surface faces downward. The support 20 is composed of a base material formed of carbon (C) with a coating of SiC applied to the outside thereof. On the front surface side of the support 20, six concave portions each having a circular shape are formed in a circumferential direction at regular intervals. On the other hand, on the back surface side of the support 20, the metallic shaft 21 extending downward from the center of the support 20 is attached. This shaft 21 protrudes to the outside of the reaction container 10 through the through hole provided in the center of the bottom of the container 11. The support 20 rotates in the direction of an arrow A shown in FIG. 2 by drive force applied to the shaft 21 from the outside of the reaction container 10.

Inside of the support 20, through holes (not shown) for supplying nitrogen $N_2$ toward the bottoms of the six concave portions provided in the support 20 are formed. Note that a technique to supply nitrogen $N_2$ to the bottoms of the six concave portions provided in the support 20 may be changed in design as appropriate.

Substrate holders 30 each having a circular shape are attached to the six concave portions provided in the front surface of the support 20. Each of the substrate holders 30 has a circular-shaped concave portion formed in the surface facing upward, and the compound semiconductor substrates 40 are attached to the respective concave portions. The substrate holders 30 are also composed of a base material formed of carbon with a coating of SiC applied to the outside thereof. Clearance is formed between the concave portions provided in the support 20 and the substrate holders 30, and these six substrate holders 30 are attachable and detachable to and from the support 20.

Each of the compound semiconductor substrates 40, as an example of a formed body, is held in the concave portion of the substrate holder 30 so that a crystal growth surface thereof, namely, a formed surface of crystals is exposed to the outside. The compound semiconductor substrates 40 are attachable and detachable to and from the respective substrate holders 30.

The substrate holders 30 rotate in the direction of an arrow B shown in FIG. 2, while holding the respective compound semiconductor substrates 40, by a flow of nitrogen $N_2$ supplied through the above-mentioned unillustrated through holes.

A heating unit 50 to heat the compound semiconductor substrates 40 through the support 20 and the substrate holders 30 is provided between the back surface side of the support 20 and the bottom of the container 11 of the MOCVD apparatus 1. The heating unit 50 has a ring shape with a hole to penetrate the shaft 21 formed therein, and contains a coil therein. The heating unit 50 heats the carbon composing the support 20 through electromagnetic induction by a current being supplied to the coil.

Additionally, a protection member 60 that prevents products produced by a reaction of the material gas supplied into the reaction chamber from adhering and depositing on the inner wall of the lid portion 12, thereby to protect the lid portion 12 is provided below the lid portion 12 and above the support 20 in the MOCVD apparatus 1. The protection member 60, as an example of a facing member, has a circular shape, and includes a through hole formed at the center thereof, which is an example of a material supply port for supplying the material gas into the reaction chamber from outside, as with the lid portion 12. Additionally, the protection member 60 also includes a through hole formed therein to observe the inside of the reaction chamber from outside, as with the lid portion 12.

The protection member 60 is attached to the lid portion 12 with an unillustrated attachment member. The attachment member is attachable and detachable to and from the lid portion 12, and because of this configuration, the protection member 60 is also attachable and detachable to and from the lid portion 12. The protection member 60 is fixed by being attached to the lid portion 12 with the attachment member.

The protection member 60 is arranged so as to cover the whole surface of the support 20 as seen from above, as shown in FIG. 2 with a broken line. Thus, the six compound semiconductor substrates 40 held by the support 20 through the respective substrate holders 30 locate below the protection member 60.

Additionally, an exhaust member 80 to guide the material gas and the like having been supplied into the reaction chamber and used for epitaxial growth of crystals toward an exhaust pipe provided in the bottom of the container 11 is attached between the support 20 and the protection member 60 of the MOCVD apparatus 1. The exhaust member 80 has a ring shape. The inner wall of the exhaust member 80 is located further outside as compared with the six concave portions provided in the support 20. Plural through holes (not shown) to exhaust the used material gas and the like to the outside are formed in the inner wall of the exhaust member 80. The exhaust member 80 is configured so as not to prevent the support 20 from rotating at a portion facing an edge of an outer circumferential portion of the support 20. In FIG. 2, illustration of the exhaust member 80 is omitted.

A monitor 90 is attached above the through hole provided in the lid portion 12 of the MOCVD apparatus 1. The monitor 90 monitors the state of the inside of the reaction chamber, more specifically, the state of crystals epitaxially growing on the compound semiconductor substrates 40 held by the support 20 through the substrate holders 30 and the state of a warp or the like of the compound semiconductor substrates 40, through the through holes respectively provided in the lid portion 12 and in the protection member 60. In order to prevent the material gas and the like from flowing into the monitor 90 through these through holes, a purge gas, such as nitrogen $N_2$, for example, is supplied from the monitor 90 toward the reaction chamber.

FIGS. 3A to 3C are views for illustrating the configuration of the protection member 60 used in the above-described MOCVD apparatus 1. FIG. 3A is a view of the protection member 60 shown in FIG. 1 seen from the support 20 side, namely, from below; FIG. 3B is a view of the protection member 60 seen from the lid portion 12 side, namely, from above; and FIG. 3C is a view showing a cross section of the protection member 60. In the following description, the surface shown in FIG. 3A is called the front surface of the protection member 60, while the surface shown in FIG. 3B is called the back surface of the protection member 60.

The protection member 60 is composed of quartz glass. A first through hole 61 for supplying the material gas is formed in the center of the protection member 60, and a second through hole 62 for the monitor 90 to monitor is formed in a region on the right side in the figures.

Additionally, 360 grooves 63 are formed in a radiating manner on the front surface side of the protection member 60, namely, in the surface facing the compound semiconductor substrates 40 in the MOCVD apparatus 1. The 360 grooves 63 are formed equiangularly at 1 degree intervals on the front surface side of the protection member 60, and each have a V-shaped cross section. The width W of each groove 63 is preferably between 0.4 mm and 2.0 mm both inclusive, for example, and may be arbitrarily varied in between in the circumferential direction. The depth D of each groove 63 is preferably between 0.2 mm and 0.8 mm both inclusive, for example. That is, due to the plural grooves 63, asperities are formed in the front surface of the protection member 60 used in the present exemplary embodiment.

Furthermore, the start points of the respective grooves 63 on the first through hole 61 side, namely, the center side are located at a radius of 100 mm from the center of the protection member 60 having a circular shape, while the end points of the respective grooves 63 on an outer circumferential edge side are located at a radius of 220 mm from the center of the protection member 60. Movement loci of the compound semiconductor substrates 40 (inner edges and outer edges) formed by rotation of the support 20 (see FIG. 2) are indicated with dotted lines in FIG. 3A. The start points of the respective grooves 63 are located on the center side with respect to the movement locus of the inner edges of the six compound semiconductor substrates 40 held by the facing support 20, while the end points of the respective grooves 63 are located outside with respect to the movement locus of the outer edges of the six compound semiconductor substrates 40 held by the facing support 20. That is, above the six compound semiconductor substrates 40 rotating while being held by the support 20, the grooves 63 provided in the front surface of the protection member 60 always face the compound semiconductor substrates 40.

Meanwhile, the end points of the respective grooves 63 are located on the center side with respect to the inner edge of the exhaust member 80 indicated with a broken line in FIG. 3A. Thus, a flat region existing on the outer circumferential edge side of the front surface of the protection member 60 faces an outer circumferential edge side of the exhaust member 80, which prevents the material gas from leaking through the grooves 63 from a facing portion between the protection member 60 and the exhaust member 80.

FIG. 4 shows a cross-sectional view of an example of a multilayer semiconductor wafer SW manufactured by using the above-described MOCVD apparatus 1. Note that a compound semiconductor composing the multilayer semiconductor wafer SW is not particularly limited, and a III-V compound semiconductor, a II-VI compound semiconductor, a IV-IV compound semiconductor and the like are listed as examples thereof. In the present exemplary embodiment, a III-V compound semiconductor is preferable, and a group III nitride compound semiconductor is particularly preferable. Hereinafter, a multilayer semiconductor wafer SW having a group III nitride compound semiconductor will be described as an example. The multilayer semiconductor wafer SW shown in FIG. 4 serves as a starting material to manufacture, for example, a blue light-emitting chip emitting blue light and further a light-emitting device using the blue light-emitting chip.

The multilayer semiconductor wafer SW includes the substrate 110, an intermediate layer 120 formed on the substrate 110, and a base layer 130, an n-type semiconductor layer 140, a light-emitting layer 150 and a p-type semiconductor layer 160 which are sequentially layered on the intermediate layer 120.

The n-type semiconductor layer 140 includes: an n-type contact layer 140a provided on the base layer 130 side; and an n-type clad layer 140b provided on the light-emitting layer 150 side. The light-emitting layer 150 has barrier layers 150a and well layers 150b alternately layered, and has a structure in which two barrier layers 150a sandwiches one well layer 150b. Furthermore, the p-type semiconductor layer 160 includes: a p-type clad layer 160a provided on the light-emitting layer 150 side; and a p-type contact layer 160b provided at the uppermost layer. In the following description, the n-type semiconductor layer 140, the light-emitting layer 150 and the p-type semiconductor layer 160 will be collectively referred to as compound semiconductor layers 100.

(Substrate 110)

The substrate 110 is composed of a material different from a group III nitride compound semiconductor. On the substrate 110, group III nitride semiconductor crystals are epitaxially grown. Listed as examples of a material composing the substrate 110 are: sapphire, silicon carbide (SiC), silicon, zinc oxide, magnesium oxide, manganese oxide, zirconium oxide, zinc iron manganese oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, and the like. Among these materials, sapphire and silicon carbide (SiC) are preferable.

(Intermediate Layer 120)

As described above, the substrate 110 is composed of a material different from a group III nitride compound semiconductor. For this reason, it is preferable to provide the intermediate layer 120 having a buffer function on the substrate 110 before films of the compound semiconductor layers 100 is formed by using the MOCVD apparatus 1 shown in FIG. 1. In particular, it is preferable that the intermediate layer 120 have a single crystal structure, from the view point of the buffer function. If a film of the intermediate layer 120 having a single crystal structure is formed on the substrate 110, the buffer function of the intermediate layer 120 effectively works, and films of the base layer 130 and the compound semiconductor layers 100 formed on the intermediate layer 120 become crystal films having excellent crystallinity.

It is preferable for the intermediate layer 120 to contain Al, and is particularly preferable to contain AlN, which is group III nitride.

(Base Layer 130)

As a material for the base layer 130, group III nitride including Ga (a GaN-based compound semiconductor) is used. In particular, AlGaN or GaN is preferably used. The film thickness of the base layer 130 is 0.1 μm or more, preferably 0.5 μm or more, and more preferably 1 μm or more.

(N-Type Semiconductor Layer 140)

The N-Type Semiconductor Layer 140 is Composed of the N-Type Contact layer 140a and the n-type clad layer 140b.

As the n-type contact layer 140a, a GaN-based compound semiconductor is used, similarly to the base layer 130. It is preferable that the gallium nitride-based compound semiconductor composing the base layer 130 have the same composition as the one composing the n-type contact layer 140a. The total film thickness of the base layer 130 and the n-type contact layer 140a is preferably set in a range of 0.1 μm to 20 μm, preferably in a range of 0.5 μm to 15 μm, and more preferably in a range of 1 μm to 12 μm.

On the other hand, the n-type clad layer 140b can be formed of AlGaN, GaN, GaInN or the like. Additionally, a structure obtained by heterojunction of structures of these compounds or a superlattice structure obtained by layering structures of these compounds several times may be employed. If GaInN is employed as the n-type clad layer 140b, it is desirable that the band gap thereof be set larger than that of the GaInN of the light-emitting layer 150. The film thickness of the n-type clad layer 140b is preferably in a range of 5 nm to 500 nm, and more preferably in a range of 5 nm to 100 nm.

(Light-Emitting Layer 150)

The light-emitting layer 150 includes the barrier layers 150a composed of a gallium nitride-based compound semiconductor and the well layers 150b composed of a gallium nitride-based compound semiconductor containing indium, these layers being alternately and repeatedly layered. In addition, the light-emitting layer 150 is formed by layering in such an order that the barrier layers 150a are arranged on the n-type semiconductor layer 140 side and the p-type semiconductor layer 160 side. In the present exemplary embodiment, the light-emitting layer 150 has the following configuration: six barrier layers 150a and five well layers 150b are alternately and repeatedly layered; the barrier layers 150a are arranged at the uppermost layer and the lowermost layer of the light-emitting layer 150; and each well layer 150b is arranged between one barrier layer 150a and the next.

For the barrier layers 150a, a gallium nitride-based compound semiconductor, such as $Al_cGa_{1-c}N$ (where $0 \leq c \leq 0.3$) or the like, having larger band gap energy than the well layers 150b composed of a gallium nitride-based compound semiconductor containing indium, for example, can be preferably used.

For the well layers 150b, gallium indium nitride, such as $Ga_{1-s}In_sN$ (where $0 < s < 0.4$), for example, can be used as a gallium nitride-based compound semiconductor containing indium.

The film thickness of the whole light-emitting layer 150 is not particularly limited, but is preferable to be enough to obtain quantum effect, namely, in a range of the critical thickness. For example, the film thickness of the light-emitting layer 150 is preferably in a range of 1 nm to 500 nm, and more preferably around 100 nm. The film thickness of each well layer 150b is not particularly limited, but is preferable to be enough to obtain quantum effect.

(P-Type Semiconductor Layer 160)

The p-type semiconductor layer 160 is composed of the p-type clad layer 160a and the p-type contact layer 160b. For the p-type clad layer 160a, $Al_dGa_{1-d}N$ (where $0 < d \leq 0.4$) is preferably taken as an example. The film thickness of the p-type clad layer 160a is preferably in 1 nm to 400 nm, and more preferably in 5 nm to 100 nm.

On the other hand, for the p-type contact layer 160b, a gallium nitride-based compound semiconductor layer including $Al_eGa_{1-e}N$ (where $0 \leq e < 0.5$) is taken as an example. The film thickness of the p-type contact layer 160b is not particularly limited, but is preferably in 10 nm to 500 nm, and more preferably in 50 nm to 200 nm.

FIG. 5 shows a cross-sectional view of a light-emitting device chip LC obtained by further processing on the above-described multilayer semiconductor wafer SW.

In the light-emitting device chip LC, a transparent positive electrode 170 is layered on the p-type contact layer 160b of the p-type semiconductor layer 160, and a positive electrode bonding pad 180 is further formed on the transparent positive electrode 170. Additionally, a negative electrode bonding pad 190 is layered on an exposed region 140c formed in the n-type contact layer 140a of the n-type semiconductor layer 140.

(Transparent Positive Electrode 170)

Listed as examples of a material composing the transparent positive electrode 170 are: ITO ($In_2O_3$—$SnO_2$), AZO (ZnO—$Al_2O_3$), IZO ($In_2O_3$—ZnO), GZO (ZnO—$Ga_2O_3$), and the like, which are conventionally known materials. The structure of the transparent positive electrode 170 is not particularly limited, and a conventionally known structure can be employed. The transparent positive electrode 170 may be formed so as to cover almost all the surface of the p-type semiconductor layer 160, or may have a grid form or a tree-like form.

(Positive Electrode Bonding Pad 180)

The positive electrode bonding pad 180 serving as an electrode formed on the transparent positive electrode 170 is composed of a conventionally known material, such as Au, Al, Ti, V, Cr, Mn, Co, Zn, Ge, Zr, Nb, Mo, Ru, Ta, Ni and Cu, for example. The structure of the positive electrode bonding pad 180 is not particularly limited, and a conventionally known structure can be employed.

The thickness of the positive electrode bonding pad 180 is in a range of 100 nm to 2000 nm, for example, and preferably in a range of 300 nm to 1000 nm.

(Negative Electrode Bonding Pad 190)

The negative electrode bonding pad 190 is formed so as to be in contact with the n-type contact layer 140a of the n-type semiconductor layer 140, in the films of the compound semiconductor layers 100 (the n-type semiconductor layer 140, the light-emitting layer 150 and the p-type semiconductor layer 160) further formed on the films of the intermediate layer 120 and the base layer 130 formed on the substrate 110. For this reason, when the negative electrode bonding pad 190 is formed, a part of the p-type semiconductor layer 160, the light-emitting layer 150 and the n-type semiconductor layer 140 is removed. Then, the exposed region 140c of the n-type contact layer 140a is formed, and the negative electrode bonding pad 190 is formed thereon.

The material of the negative electrode bonding pad 190 may have the same composition and structure as those of the positive electrode bonding pad 180. Negative electrodes having various compositions and structures are well known. These well-known negative electrodes can be used without any limitations, and can be provided by a conventional method well known in the art.

(Manufacturing Method of Compound Semiconductor Substrate 40)

First, the substrates 110 made of sapphire and having a predetermined diameter and a predetermined thickness are set in an unillustrated sputtering apparatus. Then, in the sputtering apparatus, a gas including a group V element and a metal material are activated by plasma to react with each other, thereby to form the intermediate layer 120 composed of group III nitride on each substrate 110.

Subsequently, each substrate 110 on which the intermediate layer 120 is formed is set in the MOCVD apparatus 1 shown in FIG. 1. Specifically, each substrate 110 is set in the corresponding substrate holder 30 so that the intermediate layer 120 faces outside, and each substrate holder 30 in which the substrate 110 is set is arranged in the corresponding concave portion provided in the support 20 so that the intermediate layer 120 faces upward. Then, the base layer 130 is formed on each intermediate layer 120 by using the MOCVD apparatus 1. Thereby, the compound semiconductor substrates 40 are obtained.

(Manufacturing Method of Multilayer Semiconductor Wafer SW)

FIG. 6 is a flowchart for illustrating a manufacturing method of the multilayer semiconductor wafer SW with the compound semiconductor substrates 40 as a starting material.

The compound semiconductor substrates 40 are set in the MOCVD apparatus 1 shown in FIG. 1 (Step 201). Specifically, each substrate 110 is set in the corresponding substrate holder 30 so that the base layer 130 faces outside, and each substrate holder 30 in which the substrate 110 is set is arranged in the corresponding concave portion provided in the support 20 so that the intermediate layer 120 faces upward. Then, by using the MOCVD apparatus 1, the n-type contact layer 140a is formed on each base layer 130 (Step 202), the n-type clad layer 140b is formed on the n-type contact layer 140a (Step 203), the light-emitting layer 150, namely, the barrier layers 150a and the well layers 150b are alternately formed on the n-type clad layer 140b (Step 204), the p-type clad layer 160a is formed on the light-emitting layer 150 (Step 205), and the p-type contact layer 160b is formed on the p-type clad layer 160a (Step 206). Thereby, the multilayer semiconductor wafers SW are obtained.

The n-type semiconductor layer 140 (the n-type contact layer 140a and the n-type clad layer 140b), the light-emitting layer 150 (the barrier layers 150a and the well layers 150b) and the p-type semiconductor layer 160 (the p-type clad layer 160a and the p-type contact layer 160b) are sequentially formed. That is, sequentially changing compositions of the organometallic gas MO supplied into the reaction container 10 in the film manufacturing process of the compound semiconductor layers 100 allows plural films having different compositions from each other to be sequentially formed and layered without opening the lid portion 12 of the reaction container 10 in the middle of the formation.

The configuration of the compound semiconductor substrates 40 is not limited to that described above. For example, what includes the substrate 110, the intermediate layer 120, the base layer 130 and the n-type contact layer 140a with the n-type contact layer 140a composed on the base layer 130 may be regarded as the compound semiconductor substrate 40. In this case, Step 202 may be omitted in manufacture of the multilayer semiconductor wafer SW.

(Manufacturing Method of Light-Emitting Device Chip LC)

The transparent positive electrode 170 is layered on the p-type semiconductor layer 160 of the multilayer semiconductor wafer SW obtained through the process shown in FIG. 6, and the positive electrode bonding pad 180 is formed thereon. Additionally, the exposed region 140c is formed in the n-type contact layer 140a by etching or the like, and the negative electrode bonding pad 190 is provided in this exposed region 140c.

After that, the surface of the substrate 110 opposite to the surface on which the intermediate layer 120 is formed is ground and abraded until the substrate 110 has a predetermined thickness.

The wafer in which the thickness of the substrate 110 is adjusted is then cut into a square with sides of 350 μm, for example, and thereby the light-emitting device chips LC are obtained.

Now, a description is given of the operations of the MOCVD apparatus in the above-described manufacturing method of the multilayer semiconductor wafer SW.

(Operations of MOCVD Apparatus 1)

First of all, the compound semiconductor substrates 40 are set one by one in the concave portions of the six substrate holders 30. At this time, the base layer 130 of each compound semiconductor substrate 40 is arranged to be exposed outside. Subsequently, the lid portion 12 of the reaction container 10 is opened, and the six substrate holders 30 in which the compound semiconductor substrates 40 are respectively set are set in the six concave portions provided in support 20 of the MOCVD apparatus 1. At this time, the base layer 130 of each compound semiconductor substrate 40 is arranged to face upward.

Meanwhile, the protection member 60 is arranged inside of the lid portion 12, and attached to the lid portion 12 by using the attachment member. At this time, the through hole provided in the lid portion 12 for monitoring and the second through hole 62 provided in the protection member 60 are arranged to coincide with each other.

After that, the lid portion 12 with the protection member 60 attached thereto is closed, and thereby the lid portion 12 is brought into intimate contact with the container 11.

Subsequently, supply of nitrogen $N_2$ toward the bottom of each concave portion of the support 20 through the unillustrated through holes is started in the MOCVD apparatus 1. Additionally, rotation of the shaft 21 is started. In response, the support 20 rotates in the direction of the arrow A, while the six substrate holders 30 attached to the support 20 rotate in the direction of the arrow B. As a result, the compound semiconductor substrates 40 held by the respective substrate holders 30 revolve in the direction of the arrow A, while rotating in the direction of the arrow B.

Additionally, power feeding to the coil of the heating unit 50 is started in the MOCVD apparatus 1. A current flowing through the heating unit 50 heats the support 20 through electromagnetic induction. By the support 20 heated through electromagnetic induction, the six substrate holders 30 held by the support 20 and the compound semiconductor substrates 40 held by the respective substrate holders 30 are heated up to a predetermined temperature. Furthermore, supply of a purge gas from the monitor 90 toward the reaction chamber is started.

In the MOCVD apparatus 1, the unillustrated gas supply mechanism supplies ammonia $NH_3$ and an organometallic gas MO for the n-type contact layer 140a to the reaction chamber from the supply pipe 13. With this operation, organic metal reacts with ammonia $NH_3$ around the heated compound semiconductor substrates 40 in the reaction chamber, and thereby a group III nitride compound for the n-type contact layer 140a is produced. Most of the produced group III nitride compound for the n-type contact layer 140a drops toward the support 20 located below a supply port of the material gas, and adheres to the compound semiconductor substrates 40 held by the support 20 through the respective substrate holders 30. At this time, since the compound semiconductor substrates 40 are heated up to a predetermined temperature, crystals of the group III nitride compound for the n-type contact layer 140a are epitaxially grown on the base layer 130 of each compound semiconductor substrate 40.

Along with the material gas supplied to the reaction chamber, a part of the gas already existing in the reaction chamber is exhausted to the outside of the reaction chamber through the through hole provided in the exhaust member 80, and further exhausted to the outside of the reaction container 10 through the through hole provided in the bottom of the container 11 of the reaction container 10.

In the MOCVD apparatus 1, when formation of the n-type contact layer 140a is completed, the unillustrated gas supply mechanism supplies an organometallic gas MO for the n-type clad layer 140b to the reaction chamber from the supply pipe 13, instead of the organometallic gas MO for the n-type contact layer 140a. At this time, ammonia $NH_3$ is continuously supplied to the MOCVD apparatus 1. With this operation, organic metal reacts with ammonia $NH_3$ around the heated compound semiconductor substrates 40 in the reaction chamber, and thereby a group III nitride compound for the n-type clad layer 140b is produced. Most of the produced group III nitride compound for the n-type clad layer 140b drops toward the support 20 located below the supply port of the material gas, and adheres to the compound semiconductor substrates 40 held by the support 20 through the respective substrate holders 30. At this time, since the compound semiconductor substrates 40 are heated up to a predetermined temperature, crystals of the group III nitride compound for the n-type clad layer 140b are epitaxially grown on the n-type contact layer 140a of each compound semiconductor substrate 40.

After that, by sequentially changing organometallic gases MO supplied to the reaction chamber, the light-emitting layer 150 having the plural barrier layers 150a and the plural well layers 150b and the p-type semiconductor layer 160 having the p-type clad layer 160a and the p-type contact layer 160b are sequentially formed on the n-type clad layer 140b formed on each compound semiconductor substrate 40. The multilayer semiconductor wafers SW can be obtained through the above procedure.

In the above-described manufacture process of the compound semiconductor substrates 40, the base layer 130 is formed in advance on the substrate 110 or the intermediate layer 120 by using the MOCVD apparatus 1. The base layer 130 can also be formed by using a procedure similar to that described above.

In the film manufacturing process using the above-described MOCVD apparatus 1, a part of the group III nitride compounds (reaction byproducts) produced in the reaction chamber adhere not only to the compound semiconductor substrates 40 but also to the surface of the protection member 60, for example. At this time, plural films having different compositions from each other are layered on the surface of the protection member 60, as with the compound semiconductor layers 100 formed on each compound semiconductor substrate 40.

As described above, the surface of the protection member 60 faces the compound semiconductor substrates 40 held by the support 20 through the respective substrate holders 30, and locates above the crystal growth surface of each compound semiconductor substrate 40. Additionally, the protection member 60 is composed of quartz glass, namely, a material different from the group III nitride compound semiconductor composing the compound semiconductor layers 100.

For this reason, if the protection member 60 contracts due to temperature change or the like of the reaction chamber in the film manufacturing process, a film of the group III nitride compound semiconductor having adhered or deposited on the surface of the protection member 60 may peel off from the protection member 60. In addition, if the group III nitride compound semiconductor peels off from the protection member 60, foreign particles generated by peeling-off may drop on the compound semiconductor substrates 40 located below the protection member 60. If the foreign particles having peeled off from the protection member 60 adhere on the compound semiconductor substrates 40, each of the layers composing the compound semiconductor layers 100 is further formed on the region to which the foreign particles adhere. As a result, in the resultant multilayer semiconductor wafer SW, a region to which foreign particles adhere is not available as the light-emitting device chip LC, which leads to a decrease in yield of the light-emitting device chips LC accordingly. Additionally, an excessive number or amount of foreign particles adhering to the compound semiconductor substrates 40 have no choice but to discard the resultant multilayer semiconductor wafers SW, which leads to a decrease in yield of the multilayer semiconductor wafers SW accordingly.

Consequently, in the present exemplary embodiment, the plural grooves 63 are formed in a radiating manner on the surface of the protection member 60 to increase the surface area of the protection member 60 as also shown in FIGS. 3A to 3C, thereby to suppress peeling-off of the group III nitride compound semiconductor having adhered to the surface of the protection member 60. As a result, adhesion or deposition of foreign particles on the compound semiconductor substrates 40 is suppressed in the film manufacturing process using the MOCVD apparatus 1.

Accordingly, in the present exemplary embodiment, yield of the multilayer semiconductor wafers SW can be improved, and further, yield of the light-emitting device chips LC manufactured by using the multilayer semiconductor wafers SW as the starting material can also be improved.

Meanwhile, in the MOCVD apparatus 1 of the present exemplary embodiment, the protection member 60 is reused after removing reaction byproducts adhering to the surface thereof. In the present exemplary embodiment, forming the plural grooves 63 in the surface of the protection member 60 allows the reaction byproducts having adhered to the surface of the protection member 60 to be easily rubbed off with a brush or the like. That is, the reaction byproducts having adhered to the surface of the protection member 60 can be removed by scraping with a brush in a radiating manner along the grooves 63 of the protection member 60.

Furthermore, in the present exemplary embodiment, forming the plural grooves 63 in a radiating manner in the surface of the protection member 60 allows ammonia $NH_3$ and the organometallic gas MO introduced into the reaction container 10 to be supplied in a radiating manner toward the support 20.

EXAMPLES

Next, a description will be given of an example of the present invention. However, the present invention is not limited to the example.

The inventor formed the compound semiconductor layers 100 on the compound semiconductor substrates 40 by using the MOCVD apparatus 1 shown in FIG. 1, and then examined a relationship between the composition of the protection member 60 used at that time and the number of foreign particles existing in the compound semiconductor layers 100 formed on the compound semiconductor substrates 40. Here, the MOCVD apparatus 1 being capable of mounting eight substrate holders 30, namely, eight compound semiconductor substrates 40 on the support 20 was used.

In the example, a member having plural grooves 63 formed in a radiating manner on the surface thereof as shown in FIGS. 3A to 3C was used as the protection member 60. On the other hand, in comparative examples 1 and 2, a member having a flat surface was used as the protection member 60. Additionally, in the example and the comparative example 1, a flow amount of a purge gas per unit time was set as usual, the purge gas being supplied from the monitor 90 into the reaction chamber through the through holes provided in the lid portion 12 and the protection member 60. Meanwhile, in the comparative example 2, a flow amount of the purge gas per unit time was set smaller than usual, in consideration of a possibility that reaction byproducts having adhered to the surface of the protection member 60 were peeled off by airflow of the purge gas.

Then, the film manufacturing operation was performed 56 times under each condition by using the MOCVD apparatus 1. The compound semiconductor layers 100 of the multilayer semiconductor wafers SW of 448 sheets (8 sheets×56 times) obtained under the respective conditions were observed visually. A wafer whose number of foreign particles existing in the compound semiconductor layers 100 exceeded a predetermined number (here, it was set at 20) was regarded as "rejected product," while a wafer whose number of the foreign particles was not more than the predetermined number was regarded as "accepted product."

FIG. 7 is a diagram showing an evaluation result of the example and the comparative examples 1 and 2.

In FIG. 7, the vertical axis shows the number of sheets of the multilayer semiconductor wafers SW, and shows the number of the accepted products and the rejected products in each of the example and the comparative examples 1 and 2.

As is clear from FIG. 7, only 1 of the 448 multilayer semiconductor wafers SW was a rejected product in the example, while 10 of 448 were rejected products in the comparative example 1 and 9 of 448 were rejected products in the comparative example 2.

Accordingly, it is understood that forming the grooves 63, which are a kind of asperities, on the surface of the protection member 60 attached above the compound semiconductor substrates 40, namely, the surface facing the crystal growth surfaces of the compound semiconductor substrates 40 in the MOCVD apparatus 1 suppresses peeling of the group III nitride compound semiconductor from the protection member 60 and adhesion or deposition of foreign particles on the compound semiconductor substrates 40 associated with this peeling.

In the present exemplary embodiment, the plural grooves 63 are formed in a radiating manner on the surface of the protection member 60; however, the configuration is not limited thereto.

FIGS. 8A to 8E show other configuration examples of the surface of the protection member 60.

First, as shown in FIG. 8A, multiple asperities having regularity or irregularity, for example, may be formed on the surface of the protection member 60.

Additionally, as shown in FIG. 8B, plural grooves 63 extending in one direction may be formed on the surface of the protection member 60.

Further, as shown in FIG. 8C, plural grooves 63 extending in one direction and other plural grooves 63 extending in a direction orthogonal to this one direction may be formed on the surface of the protection member 60.

Furthermore, as shown in FIG. 8D, plural grooves 63 may be concentrically formed on the surface of the protection member 60.

As shown in FIG. 8E, plural grooves 63 may be formed not concentrically but spirally on the surface of the protection member 60. FIG. 8E shows an example where one groove 63 is spirally formed; however, plural grooves 63 may be spirally formed.

In the present exemplary embodiment, the material gas is supplied from the first through hole 61 of the protection member 60 provided above the support 20; however, the configuration is not limited thereto. That is, a configuration may be such that the material gas is supplied in the horizontal direction from a lateral side of the support 20.

DESCRIPTION OF REFERENCE NUMERALS AND SIGNS

Figure 1:
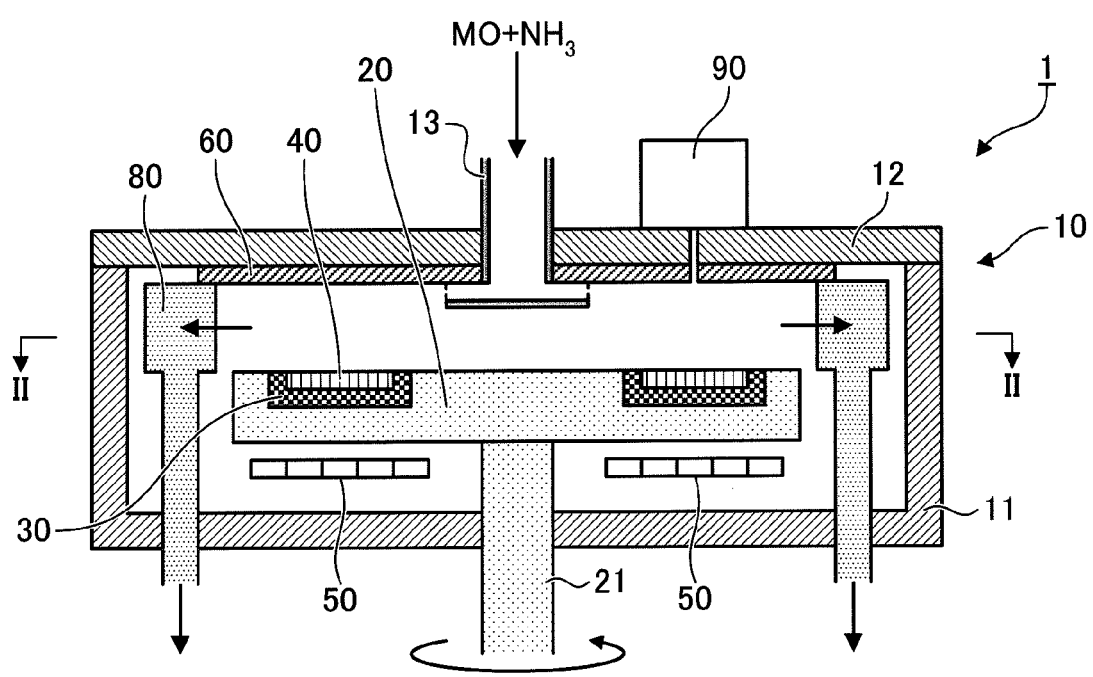
FIG. 1 is an example of a schematic diagram showing a cross-sectional configuration of an MOCVD (Metal Organic Chemical Vapor Deposition) apparatus to which the exemplary embodiment is applied.
Figure 2:
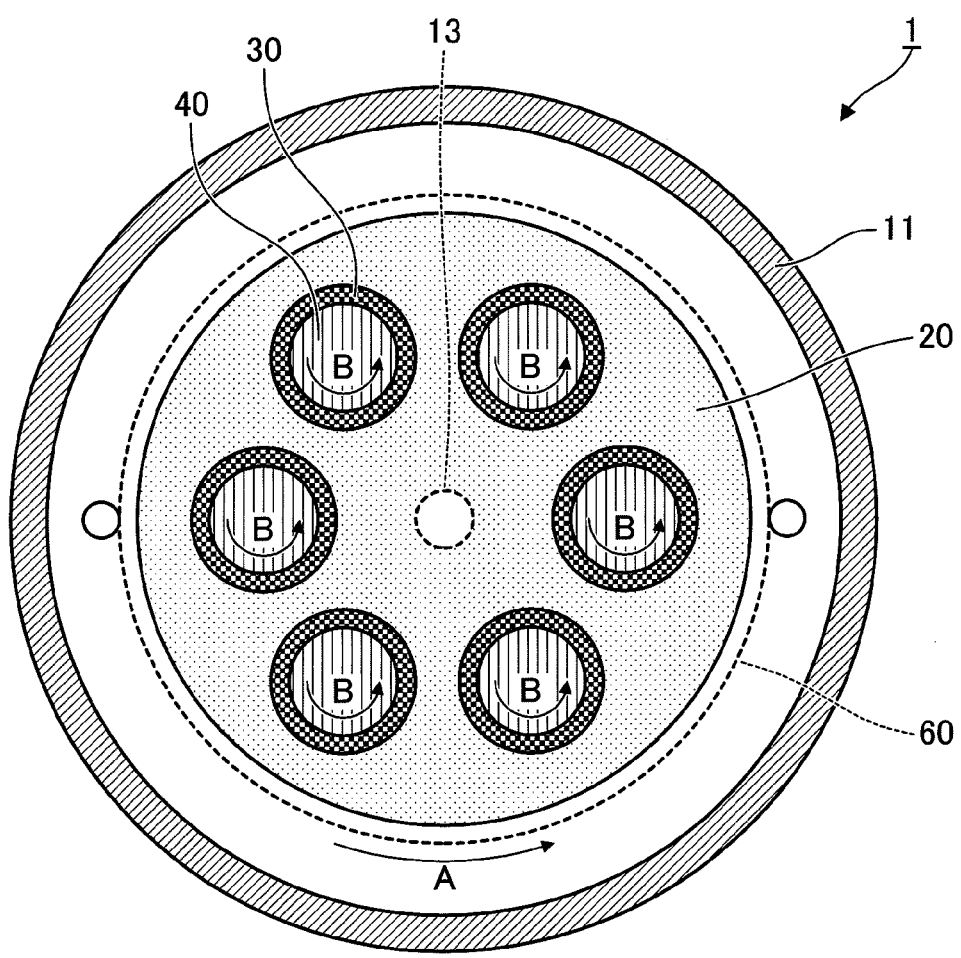
FIG. 2 is a cross-sectional view of the MOCVD apparatus shown in FIG. 1, taken along a line II-II.
Figure 3A:
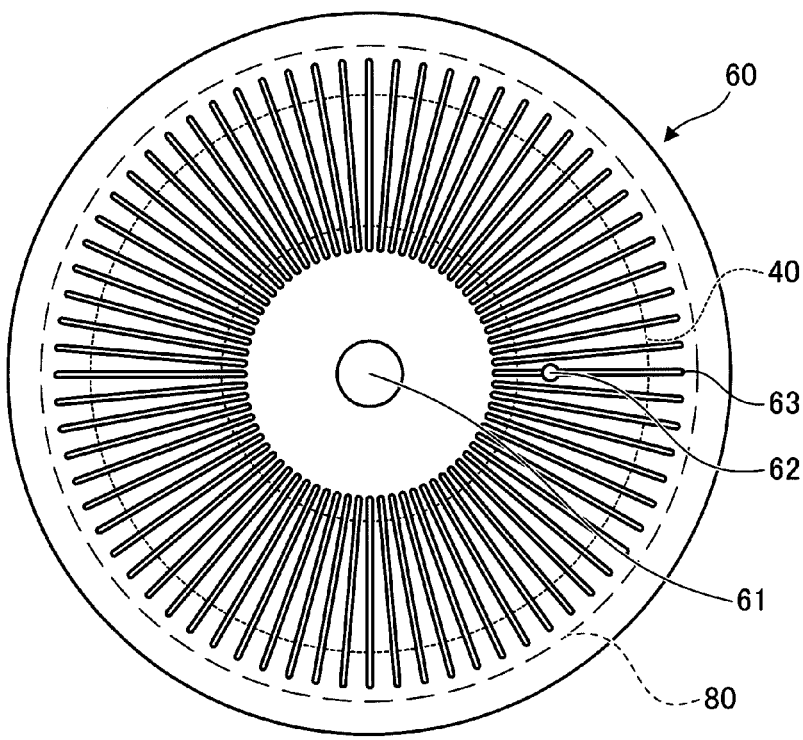
FIG. 3A is a view of the protection member seen from below.
Figure 3C:
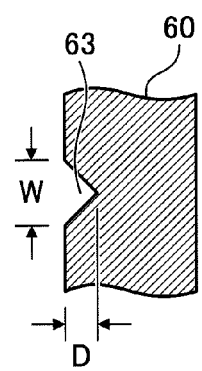
FIG. 3C is a view showing a cross section of the protection member.
Figure 3B:
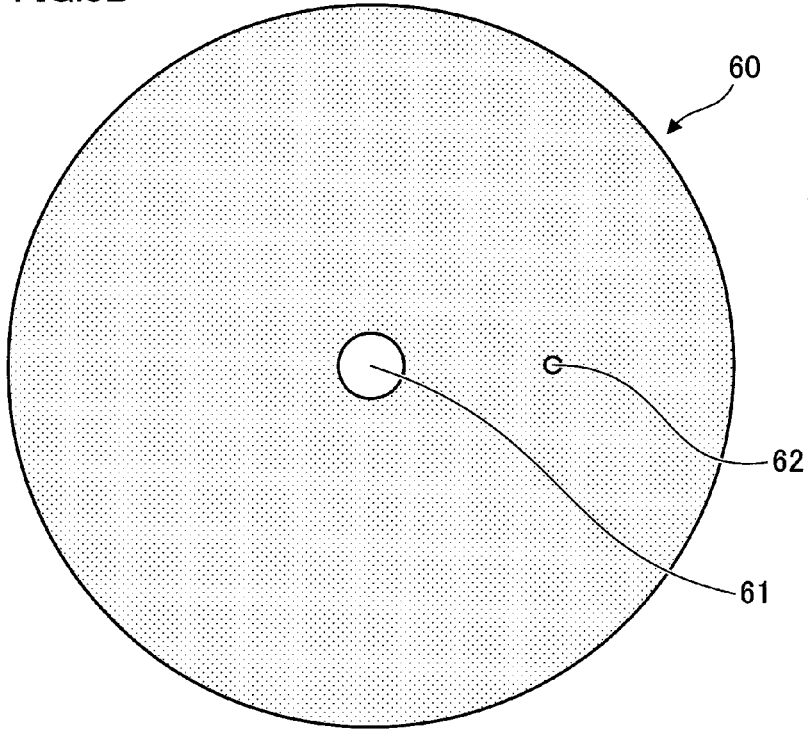
FIG. 3B is a view of the protection member seen from above.
Figure 4:
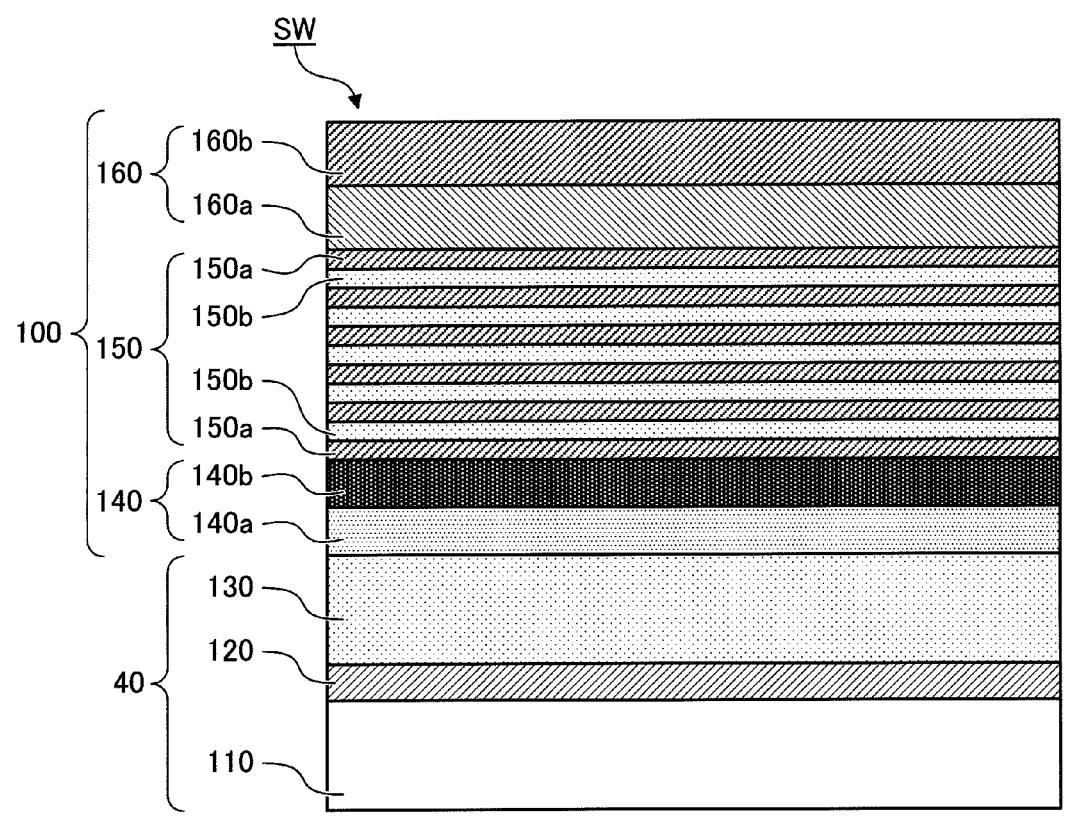
FIG. 4 is an example of a cross-sectional view of a multilayer semiconductor wafer manufactured by using the MOCVD apparatus.
Figure 5:
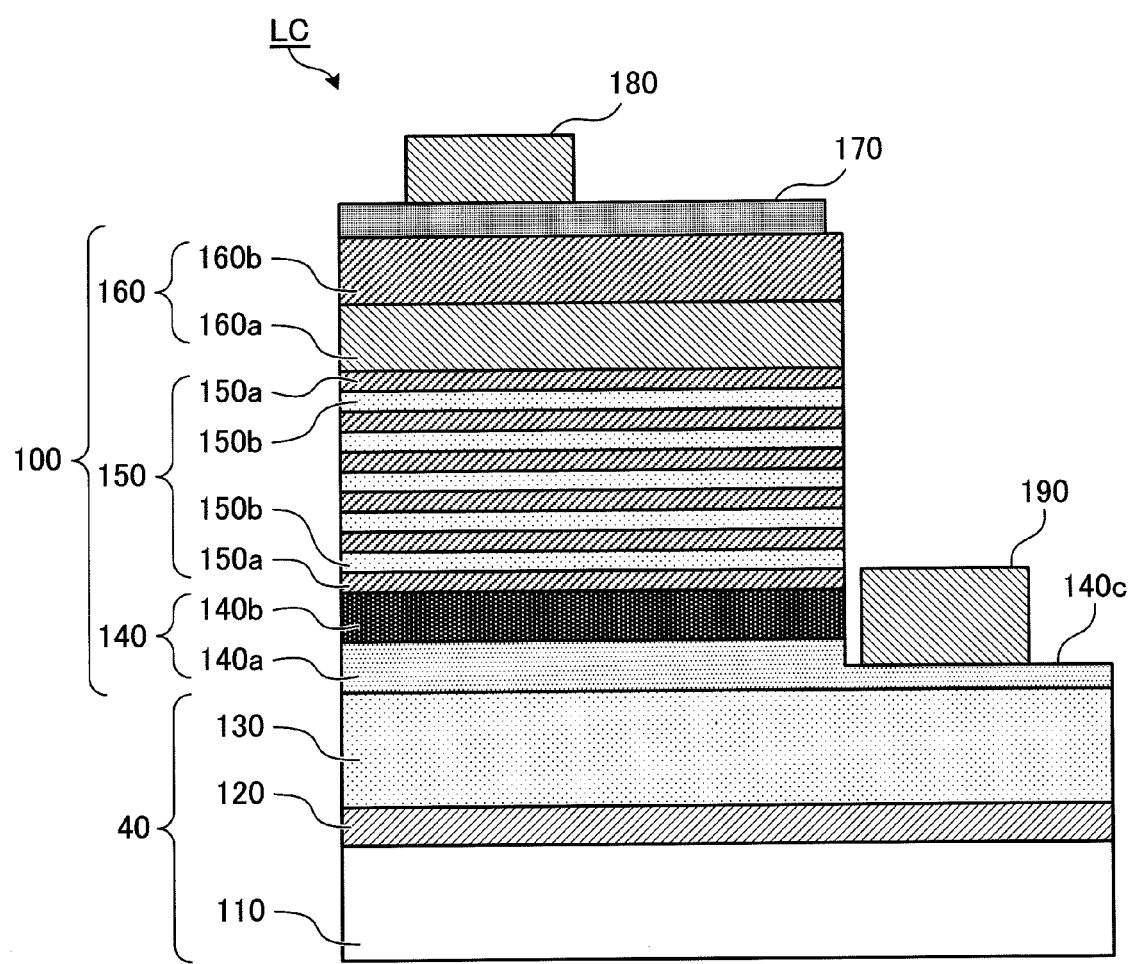
FIG. 5 is an example of a cross-sectional view of a light-emitting device chip obtained by further processing on the multilayer semiconductor wafer.
Figure 6:
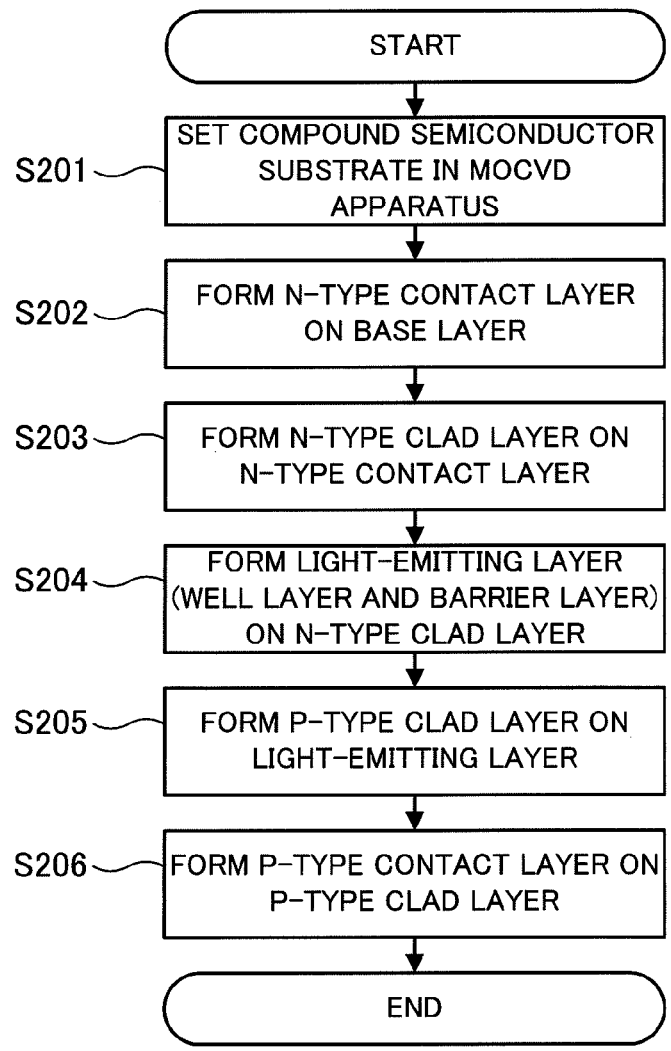
FIG. 6 is a flowchart for explaining a manufacturing method of the multilayer semiconductor wafer with the compound semiconductor substrate as a starting material.
Figure 7:
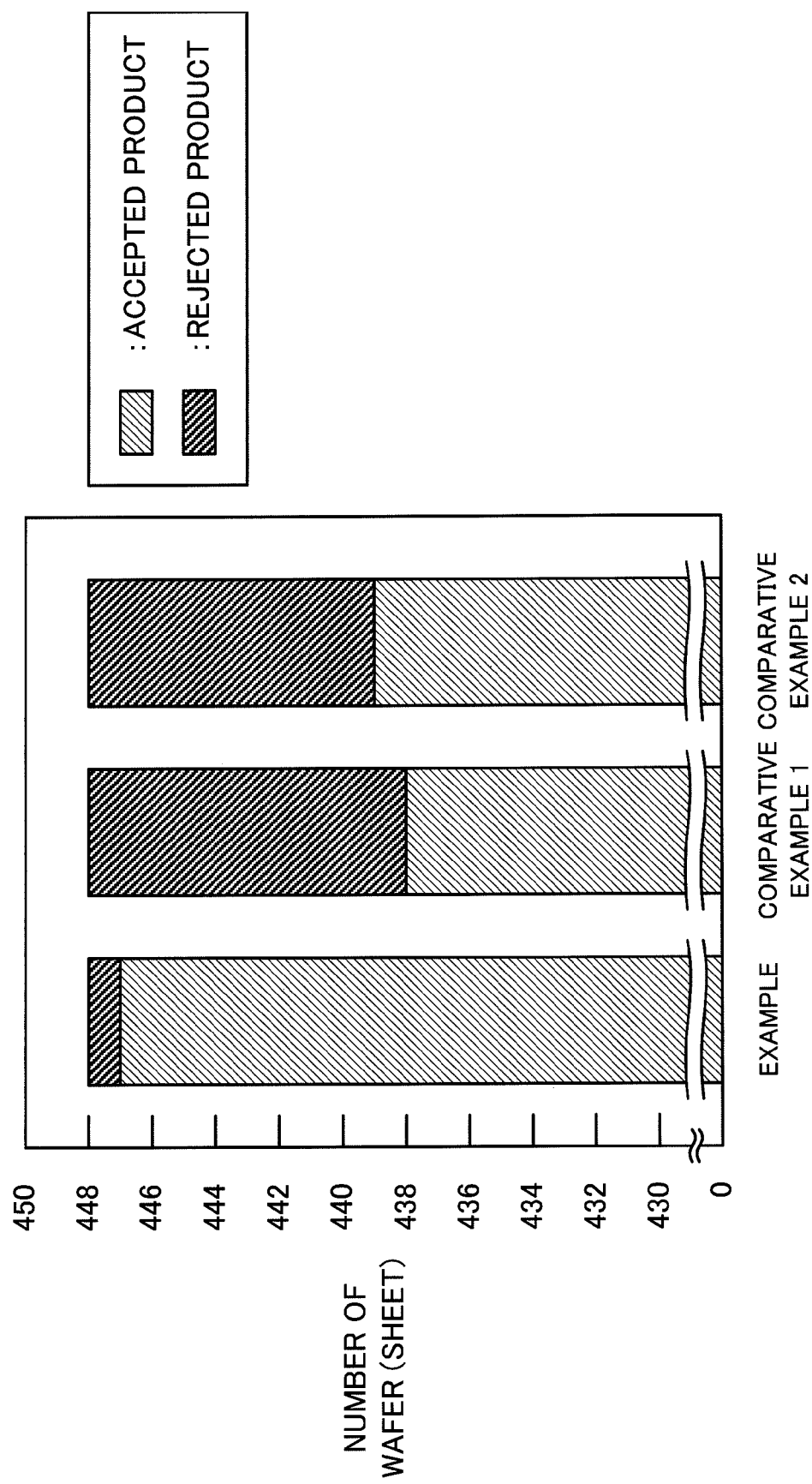
FIG. 7 is a diagram showing an evaluation result of the example and the comparative examples 1 and 2.
Figure 8C:
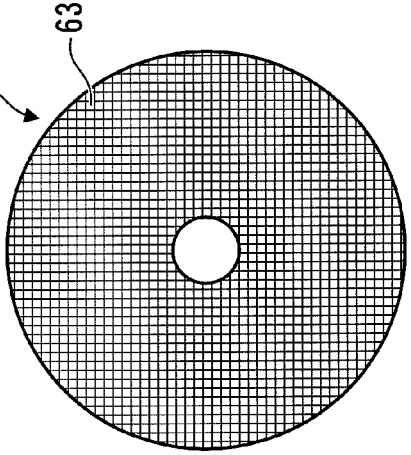
FIGS. 8A to 8E are diagrams for explaining other configuration examples of the protection member.
Figure 8B:
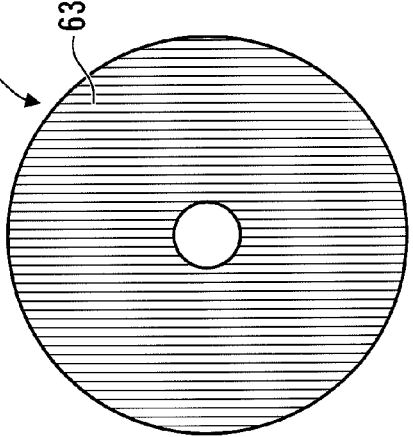
Figure 8E:
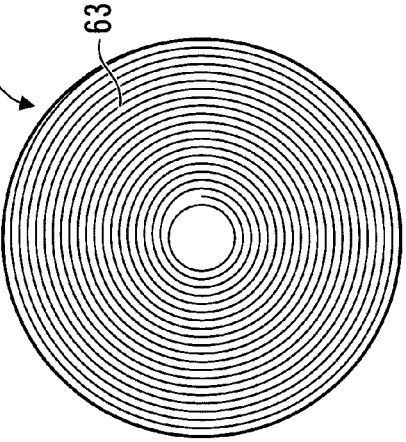
Figure 8A:
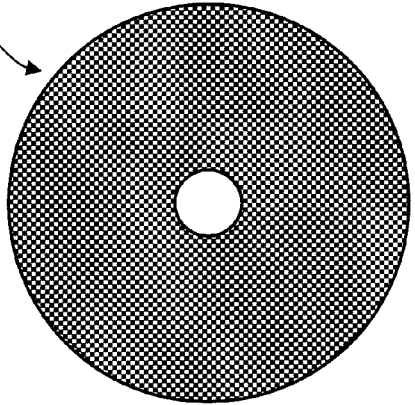
Figure 8D:
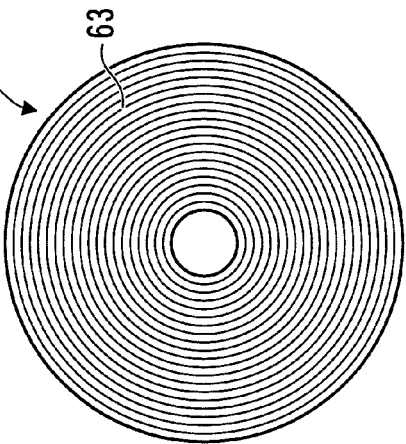

1 . . . MOCVD apparatus
10 . . . reaction container
11 . . . container
12 . . . lid portion
20 . . . support
30 . . . substrate holder
40 . . . compound semiconductor substrate
50 . . . heating unit
60 . . . protection member
63 . . . groove
100 . . . compound semiconductor layer
110 . . . substrate
120 . . . intermediate layer
130 . . . base layer
140 . . . n-type semiconductor layer
140a . . . n-type contact layer
140b . . . n-type clad layer
150 . . . light-emitting layer
150a . . . barrier layer
150b . . . well layer
160 . . . p-type semiconductor layer
160a . . . p-type clad layer
160b . . . p-type contact layer
170 . . . transparent positive electrode
180 . . . positive electrode bonding pad
190 . . . negative electrode bonding pad
SW . . . multilayer semiconductor wafer
LC . . . light-emitting device chip

The invention claimed is:

1. A compound semiconductor manufacturing device for forming layers of a compound semiconductor on a first side of a substrate by use of metal organic chemical vapor deposition method comprising:
    a reaction container;
    a material supply port supplying a material gas of the compound semiconductor into the reaction container from outside;
    a support placed in the reaction container, the support supporting the substrate so that the first side of the substrate faces upward; and
    a facing member placed above the substrate supported by the support, the facing member including a facing surface having asperities formed thereon, the facing surface facing and directly opposing the first side of the substrate.

2. The compound semiconductor manufacturing device according to claim 1, wherein a groove composed of a continuous concave is formed in the facing surface of the facing member.

3. The compound semiconductor manufacturing device according to claim 2, wherein
    the material supply port is composed of a through hole provided for the facing member, and
    the groove extending at least in part from inside to outside with the through hole as a center is formed in the facing surface of the facing member.

4. The compound semiconductor manufacturing device according to claim 3, wherein the groove is a plurality of grooves formed in a radiating manner with the through hole as a center.

5. A compound semiconductor manufacturing method for forming layers of a compound semiconductor on a first side of a substrate by use of metal organic chemical vapor deposition method comprising:
    attaching the substrate in a reaction container so that the first side of the substrate faces upward;
    placing a facing member above the substrate, the facing member including a facing surface having asperities formed thereon, the facing surface facing and directly opposing the first side of the substrate; and supplying a material gas of the compound semiconductor into the reaction container.

6. The compound semiconductor manufacturing method according to claim 5, wherein a continuous groove is formed in the facing surface.

7. The compound semiconductor manufacturing method according to claim 6, wherein the material gas is supplied into the reaction container through a through hole provided for the facing member, and the groove extending at least in part from inside to outside with the through hole as a center is formed in the facing surface.

8. The compound semiconductor manufacturing method according to claim 7, wherein the groove is a plurality of grooves formed in the facing surface in a radiating manner with the through hole as a center.

9. A jig for manufacturing a compound semiconductor used in a compound semiconductor manufacturing device for forming layers of a compound semiconductor on a first side of a substrate by use of metal organic chemical vapor deposition method comprising:

a facing surface having asperities, the facing surface facing and directly opposing the substrate above the substrate placed so that the first side thereof faces upward; and a material supply port formed so as to penetrate the facing surface and a back side of the facing surface, the material supply port supplying a material gas of the compound semiconductor to the substrate from above the substrate.

10. The jig for manufacturing a compound semiconductor according to claim 9, wherein a continuous groove is formed in the facing surface.

11. The jig for manufacturing a compound semiconductor according to claim 10, wherein the groove extending at least in part from inside to outside with the material supply port as a center is formed in the facing surface.

12. The jig for manufacturing a compound semiconductor according to claim 11, wherein the groove is a plurality of grooves formed in a radiating manner with the material supply port as a center.

* * * * *